Aug. 23, 1960 JUNICHI YASUDA ET AL 2,950,385

TRANSISTOR OSCILLATOR

Filed Nov. 26, 1957

United States Patent Office 2,950,385

Patented Aug. 23, 1960

2,950,385

TRANSISTOR OSCILLATOR

Junichi Yasuda, Nobuo Kanoi, and Tsuneo Takahata, Tokyo, Japan, assignors to Sony Kabushikikaisha (Sony Corporation), Shinagawa-ku, Tokyo, Japan, a corporation of Japan Filed Nov. 26, 1957, Ser. No. 699,075

Claims priority, application Japan May 18, 1957

3 Claims. (Cl. 250—20)

This invention relates to a transistor oscillator which can produce oscillation current of a wide frequency range covering comparatively higher frequencies and more particularly to a transistor oscillator coupled to a short wave converter circuit without any appreciable pull-in phenomenon.

In a superheterodyne radio receiving apparatus, a local oscillator is affected by the current of a signal tuning circuit based upon so-called pull-in phenomenon and the pull-in phenomenon becomes greater in the shorter wave length ranges.

One object of this invention is to provide a transistor oscillator which can produce frequencies of wide range in stretching the upper limit of the frequency range.

Another object of this invention is to provide a transistor oscillator connection which can reduce the pull-in phenomenon.

A further object of this invention is to provide a short wave converter circuit connected to a transistor oscillator without having any appreciable pull-in phenomenon.

Other objects, features and advantages of this invention will be more apparent from the following detailed description taken in connection with the accompanying drawing in which.

Figure 1:
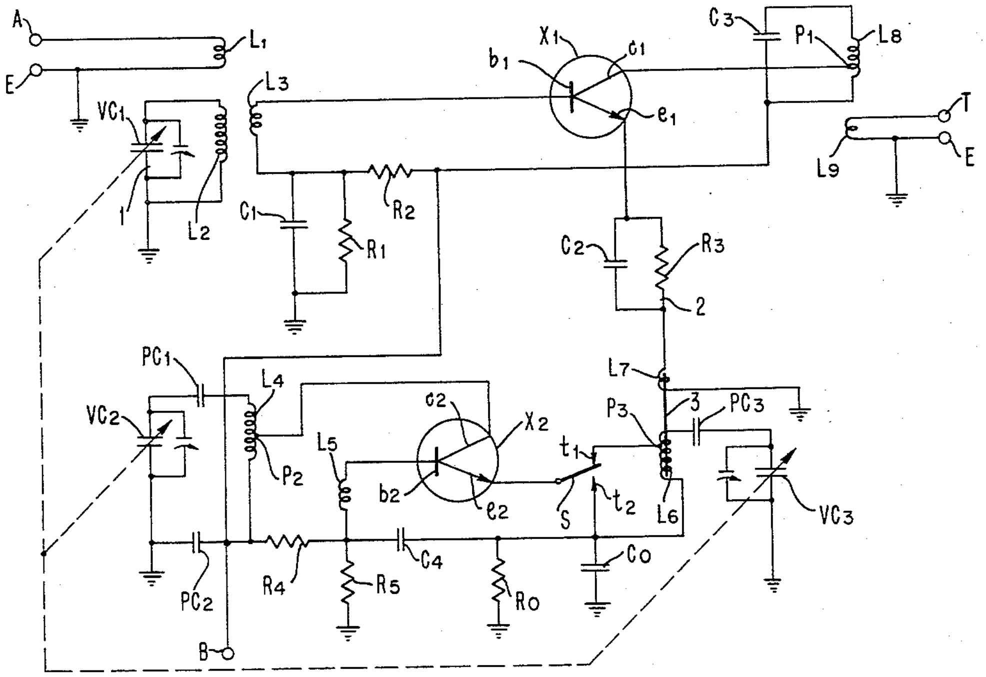
Fig. 1 is a schematic diagram of a transistor oscillator connected to a short wave converter circuit according to this invention.

Referring to the drawing, Fig. 1 shows a short wave converter circuit to which a transistor oscillator according to this invention is connected. A and E are signal input terminals; $L_1$ an antenna coil and 1 a tuning circuit composed of a parallel connection of a coil $L_2$ and a capacitor $VC_1$. The coil $L_2$ is coupled to the secondary coil $L_3$ one end of which is connected to the base $b_1$ of a transistor $X_1$, the other end of which is connected to ground through a by-pass capacitor $C_1$. $R_1$ and $R_2$ show respectively voltage dividing resistors giving an adequate voltage to the transistor base $b_1$ from a source B.

The transistor $X_1$ is of a n-p-n grown type for high frequency use, the collector thereof being connected to the tap $P_1$ of a coil $L_8$ of an intermediate frequency transformer. $L_9$ is the secondary side coupling to the coil $L_8$ and its terminals T and E are led to an ordinary radio receiving apparatus so as to supply a current of intermediate frequency of, say 540 kilo-cycles per second, to the latter.

The emitter $e_1$ of the transistor $X_1$ is connected to ground through a stabilizing circuit 2 consisting of a parallel circuit of a capacitor $C_2$ and a resistor $R_3$. $X_2$ is a transistor of the n-p-n grown type used for high frequency similar to the transistor $X_1$ and used, in this case, as a local oscillator. $L_4$ is a main local oscillation coil the tap $P_2$ of which is connected to the collector $c_2$ of the transistor $X_2$. $VC_2$ is a tuning variable capacitor; $PC_1$ and $PC_2$ are by-pass capacitors; and $L_5$ is a back coupling coil connected to the base $b_2$ of the transistor $X_2$. It is apparent that the circuit including $L_4$ and $VC_2$ mainly determines the oscillation frequency. $R_4$ and $R_5$ are voltage dividing resistors giving an adequate voltage to the base $b_2$ from the source B. $C_4$ designates a by-pass capacitor and $R_0$ and $C_0$ respectively represent a resistor and capacitor forming a by-pass circuit.

In accordance with this invention, between the emitter $e_2$ and the ground E is connected a tuning circuit which forms an adequate capacitive reactance in view from the two points $e_2$ and E. That is, this tuning circuit is composed of a coil $L_6$ and a variable capacitor $VC_3$ and the tuning frequency $\omega_0$ of the circuit is slightly higher than the oscillation frequency $\omega$. The tap $P_3$ of the coil $L_6$ is connected to the emitter $e_2$ by a change-over switch S and the impedance between the emitter and ground has an adequate capacitive reactance with respect to the oscillation frequency. $PC_3$ is a by-pass padding capacitor similar to the capacitors $PC_1$ and $PC_2$.

A coil $L_7$ is inserted between the circuit 2 and ground and coupled to the coil $L_6$ so as to supply the oscillation energy produced by the local oscillation circuit including the transistor $X_2$ to the upper converter circuit including the transistor $X_1$.

Figure 2:
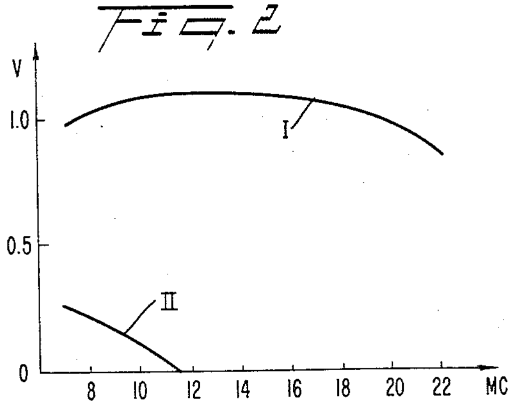
Fig. 2 illustrates the frequency characteristic curve of the circuit shown in Fig. 1 as compared with a frequency characteristic curve of an ordinary transistor oscillator.

In the above described connection according to this invention, the local oscillator has the oscillation frequency characteristic curve I shown in Fig. 2, which covers the frequency range of substantially 6.5 to 20 mega-cycles per second. If, however, a change-over switch S is turned from a contact point $t_1$ which is connected to the tap $P_3$ to a contact point $t_2$ which is connected to the upper point of the capacitor $C_0$, which upper point is considered as substantially the ground potential, so that the capacitive reactance circuit composed of the coil $L_6$ and the capacitor $VC_3$ is disconnected from the whole circuit, that is, if an ordinary oscillation circuit having a bias circuit which is composed of the resistor $R_0$ and capacitor $C_0$ is used, such an ordinary oscillation circuit can not operate at the higher frequency range such as shown by the curve I of Fig. 2 but only oscillates at a far lower frequency range and with lower level, as shown by a curve II.

Figure 3:
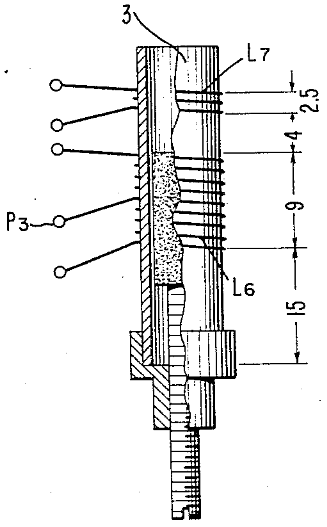
Fig. 3 is a fragmentary sectional front view of a coupling coil arrangement used in the circuit shown in Fig. 1.

Fig. 3 shows a coupling coil arrangement used in experiments of this invention.

This coil arrangement has a bobbin 3 having a ferrite core, the coil $L_6$ having 10 turns of an insulated wire of 0.4 millimeters in diameter and having an inductance of 1.93 microhenries, the tap $P_3$ being attached at the point of 6:4 of the turns, and the coil $L_7$ coupled with the coil $L_6$ having two turns of the same insulated wire as the coil $L_6$. The variable capacitor $VC_3$ cooperating with the coil $L_6$ has the capacity of 15 to 330 micro-farads and is ganged with the capacitors $VC_1$ and $VC_2$ which have respectively the same capacity as the capacitor $VC_3$.

It is appreciated that according to this invention the value of the capacitive reactance of the capacitor $VC_3$ should be selected as smaller than $1/100$ of the ordinary by-pass capacitor $C_0$ of about 0.05 micro-farads.

Curve I shown in Fig. 2 is obtained by using the circuit shown in Fig. 1 applying the above mentioned parts with the value referred to the above.

It will be apparent from the experiments that the oscillator according to this invention can oscillate at frequencies of wide range in stretching the upper limit of the frequency as shown by the curve I, as compared with the curve II which is plotted when changing the switch S to the contact point $t_2$ so as to form an ordinary transistor oscillator connection.

In the prior art, an oscillation energy has been taken from the coil $L_4$ of the oscillation circuit including the transistor $X_2$ through magnetic coupling.

The disadvantage of the above mentioned pull-in phenomenon occurs in this ordinary connection.

In accordance with this invention, on the contrary, coupling coil $L_7$ is coupled to the coil $L_6$ inserted in the emitter circuit of the oscillation transistor $X_2$. In this connection, the oscillation energy is led from the emitter side which is the lower impedance part to the higher impedance part of the converter circuit with comparatively small reaction so that the pull-in phenomenon can be minimized.

While we have explained a particular embodiment of our invention, it will be understood, of course, that we do not wish to be limited thereto since many modifications may be made and we, therefore, contemplated by the appended claims to cover any such modifications as fall within the spirit and scope of our invention.

What is claimed is:

1. In a frequency translation system, in combination, a variably tuned converter circuit for receiving modulated input signals of relatively high frequencies and having a single intermediate frequency output comprising a first semi-conductor device having a semi-conductive body and base, emitter and collector electrodes cooperatively associated therewith, a variably tuned separate local oscillator circuit for generating a local oscillation for translating the incoming signals to the intermediate-frequency output, said oscillator circuit comprising a second semiconductor device having a semi-conductive body and base, emitter and collector electrodes, means including a source of operating bias voltage for applying suitable biasing potentials to the electrodes of both of said semiconductor devices, a variably tuned capacitive reactance circuit electromagnetically coupled to the converter circuit and directly coupled to the emitter electrode of the second semi-conductor device in parallel therewith to provide oscillatory energy generated in the oscillator circuit and a suitable capacitive reactance with respect to the local oscillation frequency, and an equalizing circuit in the converter circuit connected to the emitter of said first semi-conductive device having capacitance and inductance means coupled to the emitter of the second semi-conductor device for electromagnetically coupling the converter circuit and the capacitive reactance circuit thereby to form in combination a frequency translation system in which the oscillator circuit functions over a relative broad range of frequencies which is much broader than a range of frequencies at which the oscillator functions in the absence of said capacitive reactance circuit.

2. In a frequency translation system, in combination, a variably tuned converter circuit for receiving modulated input signals of relatively high frequencies and having a single intermediate frequency output comprising a first semi-conductor device having a semi-conductive body and base, emitter and collector electrodes cooperatively associated therewith, a variably tuned separate local oscillator circuit for generating a local oscillation for translating the incoming signals to the intermediate-frequency output, said oscillator circuit comprising a second semiconductor device having a semi-conductive body and base, emitter and collector electrodes, an oscillation coil connected to ground and to the collector of said second semiconductor, means including a source of operating bias voltage for applying suitable biasing potentials to the electrodes of both of said semi-conductor devices, a variably tuned capacitive reactance circuit electromagnetically coupled to the converter circuit including a coil directly coupled to the emitter electrode of the second semi-conductor device in parallel therewith to provide oscillatory energy generated in the oscillator circuit to the converter circuit and a suitable capacitive reactance with respect to the local oscillation frequency, and means to variably tune the three tuned circuits simultaneously, thereby to form in combination a frequency translation system in which the oscillator circuit functions over a relative broad range of frequencies which is much broader than a range of frequencies at which the oscillator functions in the absence of said capacitive reactance circuit.

3. In a frequency translation system, in combination, a variably tuned converter circuit for receiving modulated input signals of relatively high frequencies and having a single intermediate frequency output comprising a first semi-conductor device having a semi-conductive body and base, emitter and collector electrodes cooperatively associated therewith, a variably tuned separate local oscillator circuit for generating a local oscillation for translating the incoming signals to the intermediate-frequency output, said oscillator circuit comprising a second semiconductor device having a semi-conductive body and base, emitter and collector electrodes, means including a source of operating bias voltage for applying suitable biasing potentials to the electrodes of both of said semi-conductor devices, a variably tuned capacitive reactance circuit electromagnetically coupled to the converter circuit including a coil directly coupled to the emitter electrode of the second semi-conductor device in parallel therewith to provide oscillatory energy generated in the oscillator circuit to the converter circuit and a suitable capacitive reactance with respect to the local oscillation frequency thereby to form in combination a frequency translation system in which the oscillator circuit functions over a relative broad range of frequencies which is much broader than a range of frequencies at which the oscillator functions in the absence of said capacitive reactance circuit.

References Cited in the file of this patent

UNITED STATES PATENTS

| | | |
|---|---|---|
| 2,742,571 | Herzog | Apr. 17, 1956 |
| 2,750,507 | Law et al. | June 12, 1956 |
| 2,750,508 | Waldhauer | June 12, 1956 |
| 2,757,287 | Stanley | July 31, 1956 |

OTHER REFERENCES

Article, "The Thunderbird—A New Transistorized Portable Radio" by Vanacore in "The Sylvania Technologist," April 1957, pages 35–37.